(12) United States Patent
De Bosscher et al.

(10) Patent No.: US 11,875,979 B2
(45) Date of Patent: Jan. 16, 2024

(54) FEEDBACK SYSTEM

(71) Applicant: SOLERAS ADVANCED COATINGS BVBA, Deinze (BE)

(72) Inventors: Wilmert De Bosscher, Drongen (BE); Ivan Van De Putte, Waregem (BE)

(73) Assignee: SOLERAS ADVANCED COATINGS BV, Deinze (BE)

( * ) Notice: Subject to any disclaimer, the term of this patent is extended or adjusted under 35 U.S.C. 154(b) by 992 days.

(21) Appl. No.: 16/614,841

(22) PCT Filed: May 17, 2018

(86) PCT No.: PCT/EP2018/062836
§ 371 (c)(1),
(2) Date: Nov. 19, 2019

(87) PCT Pub. No.: WO2018/215274
PCT Pub. Date: Nov. 29, 2018

(65) Prior Publication Data
US 2020/0090906 A1    Mar. 19, 2020

(30) Foreign Application Priority Data

May 22, 2017  (BE) .................................. 2017/5374

(51) Int. Cl.
*C23C 14/35* (2006.01)
*H01J 37/32* (2006.01)
*H01J 37/34* (2006.01)

(52) U.S. Cl.
CPC .......... *H01J 37/3299* (2013.01); *C23C 14/35* (2013.01); *H01J 37/32972* (2013.01); *H01J 37/3405* (2013.01); *H01J 37/3476* (2013.01)

(58) Field of Classification Search
CPC ..... C23C 14/35; C23C 14/547; C23C 14/562; H01J 37/3277; H01J 37/32926;
(Continued)

(56) References Cited

U.S. PATENT DOCUMENTS

| 2005/0178651 A1 | 8/2005 | Ranjan et al. |
| 2014/0097080 A1 | 4/2014 | Heinrich et al. |

(Continued)

FOREIGN PATENT DOCUMENTS

| CN | 103710673 A | 4/2014 |
| WO | 0176326 A1 | 10/2001 |

(Continued)

OTHER PUBLICATIONS

Office Action from corresponding Chinese Application No. 201880031848.7, dated Oct. 20, 2021.
(Continued)

*Primary Examiner* — Rodney G McDonald
(74) *Attorney, Agent, or Firm* — Workman Nydegger

(57) ABSTRACT

A feedback system for controlling properties of a single layer or multiple layer stack is applied on a substrate by means of a vacuum coating process controlled by a plurality of process controlling means. The system includes at least one monitoring device for at least implementing at least two distinct measurement techniques for determining measurement signals at each of a plurality of locations spatially distributed over the coated substrate; at least one processing unit adapted for at least receiving the measurement signals; and a controller for at least providing actuation signals for actuating the plurality of process controlling means.

17 Claims, 6 Drawing Sheets

(58) Field of Classification Search
CPC ............. H01J 37/32972; H01J 37/3299; H01J 37/3405; H01J 37/347; H01J 37/3476; H01L 31/1884; H01L 22/12; H01L 22/26
USPC ........................................ 204/192.13, 298.03
See application file for complete search history.

(56) References Cited

U.S. PATENT DOCUMENTS

2014/0186975 A1   7/2014  Buller et al.
2015/0021294 A1   1/2015  Togami et al.

FOREIGN PATENT DOCUMENTS

WO      2009143921 A1   12/2009
WO      2014105557 A1   7/2014

OTHER PUBLICATIONS

Belgian Search Report from BE Application No. BE201705374, dated Dec. 28, 2017.
Partial International Search Report from PCT Application No. PCT/EP2018/062836, dated Jul. 9, 2018.
International Search Report & Written Opinion from PCT Application No. PCT/EP2018/062836, dated Sep. 18, 2018.

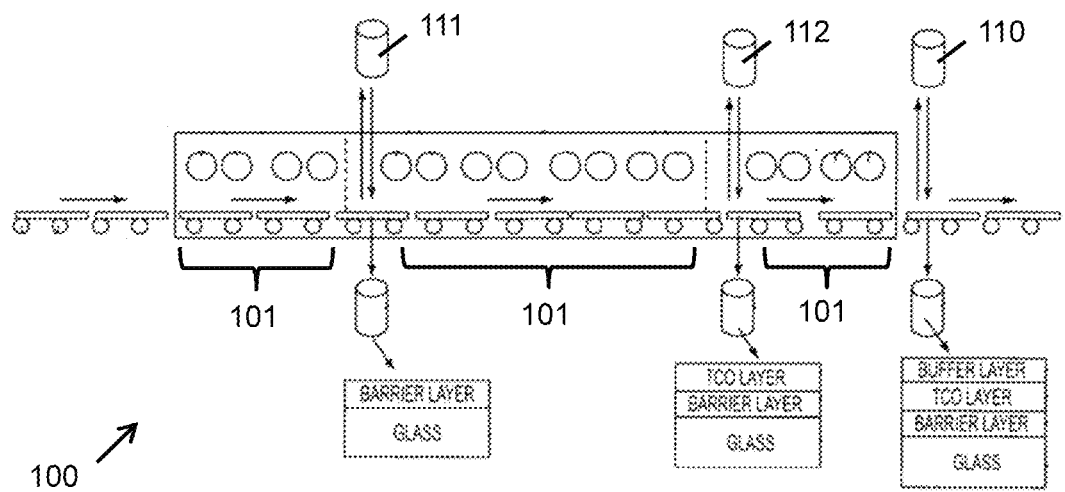
FIG. 1 – PRIOR ART
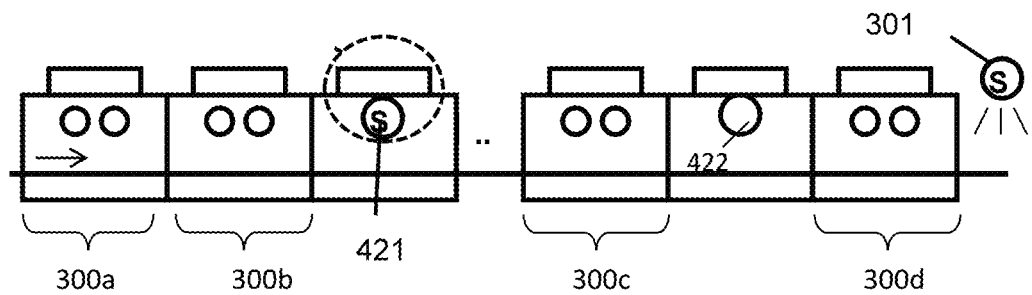
FIG. 3

FEEDBACK SYSTEM

FIELD OF THE INVENTION

The present invention relates generally to the field of vacuum coating, for instance sputtering. More particularly, the present invention relates to monitoring devices and to methods for controlling properties of a single layer or multiple layer stack being applied on a blank or coated substrate by means of a vacuum coating process controlled by a plurality of process controlling means.

BACKGROUND OF THE INVENTION

The technique of material depositing by means of vacuum coating has been known for decades already and therefore does not need to be further explained. Suffice it to say that, for example for a sputter deposition process, typically a plasma is generated in a low-pressure chamber in which an inert gas such as argon, possibly combined or replaced with an active gas such as oxygen or nitrogen is present for depositing a layer of the sputtering material on a 'substrate', and that a high voltage is applied across a so-called 'sputtering target' (which contains the material that is to be sputtered). Some gas atoms are ionised and the sputtering target is bombarded with these ions, causing atoms to be detached from the sputtering target, and deposited on the substrate.

Coatings may consist of one layer of deposited material, or of several layers, e.g. three or six or ten or fourteen, or even more than fourteen layers of various materials which are deposited on top of each other. By a suitable selection of the properties of each layer, e.g. thickness or conductivity, and by a suitable choice of material, custom coating stacks can be obtained, with very specific properties. However, it is a technical challenge to obtain the envisioned specific properties due to the challenge of controlling properties for each individual layer in a production batch. It is even more challenging to moreover also obtain uniform properties over relatively large surface areas, such as e.g. displays or windscreens of cars, or glass for windows for a house or office building.

In-line measurements of layer property values of a layer or layer stack is desired, to allow measurements of each layer of the device in real-time. Real-time measurements may allow, for instance, for real-time correction of undesired manufacturing variances and may ensure stable in-spec product manufacturing. It is known that complex and insufficiently controlled processes may lead to undesired yield loss of the resulting product.

In WO2014/105557A1 of First Solar Inc., a sputtering installation is described that is optimised to produce one specific, fixed coating stack of three layers for photovoltaic devices. This sputtering installation 100 is schematically shown in FIG. 1, which is a replica of FIG. 2 from WO2014/105557A1, and comprises an ex-situ optical measurement system 110 at the end of the production line for acquiring optical data, e.g. reflection and/or transmission data, of the complete coating, as well as two in-situ optical measuring systems 111, 112 for acquiring optical data of a partial coating stack with one layer and two layers, respectively, after the application of each layer. The measurement data is collected by a computer system with a software package for optical modelling that is able to calculate the most likely actual layer thickness and optical constant values of each deposited layer, making use of so-called 'curve-fitting techniques', based on the measurement data and on the parameters of the coating stack to be produced (e.g., the materials and the envisioned thickness of each layer), and on known material properties. The modelling analysis output may be used for both monitoring and control of the deposition conditions for the layer being deposited. For example, if the calculated thickness of the deposited layers is not a desired value, a controller may signal the deposition system to cause a change in the deposition conditions for production of subsequent substrates. An example given in WO2014/105557A1 is, if the result of the modelling shows that the deposited layer has a thickness value outside an acceptable range, to cause a change in the power used to sputter the material in order to bring the thickness back within the desired range.

It is known, however, that particular deposition conditions may influence same layer parameters in a different manner. For instance, "Electrical and optical properties of ITO thin films prepared by DC magnetron sputtering for low-emitting coatings" of Hadi Askari et al. discloses a relationship between sputtering power and oxygen flow on electrical resistance and infrared reflection of an ITO layer. In particular, this document discloses the variation of electrical and optical properties for ITO films grown at different oxygen flow. All films were deposited in 4.3 kW sputtering power and the substrate deposition temperature was 400° C. It can be seen from the document that optical transmission does not change much by oxygen flow, but optical reflection increases severely with decreasing oxygen flow, in the IR area. On the other hand, sheet resistance reaches an optimum (minimum) at an intermediate value of the oxygen flow.

SUMMARY OF THE INVENTION

It is an object of embodiments of the present invention to provide a good solution for improving the control of the coating of single or multilayer coatings on a substrate, such as for instance glass.

The above objective is accomplished by a method and device according to the present invention.

In a first aspect, the present invention provides a feedback system for controlling properties of a single layer or multiple layer stack being applied on a blank or coated substrate by means of a vacuum coating process controlled by a plurality of process controlling means. The feedback system comprises at least one monitoring device for implementing at least two distinct measurement techniques for determining measurement signals at each of a plurality of locations spatially distributed over the coated substrate, whereby a first measurement technique is adapted for being applied simultaneously to a plurality of locations, and a second measurement technique is adapted for being applied to at least one location, one of the first and second measurement techniques being a spectral transmission measurement, at least one processing unit adapted for receiving the measurement signals, configured for determining, from the received measurement signals, actual values of a first layer property at the plurality of locations, and of a second layer property different from the first layer property at the at least one location, and/or for determining deviations between the actual first and second layer property values and desired layer property values, and a controller for providing actuation signals for actuating the plurality of process controlling means, and for generating further control signals to further drive at least one of the plurality of process controlling means in the coating process based on the determined values and/or deviations between the actual layer property values and the desired layer property values and on knowledge from a layer model expressing layer parameters as a function of settings and/or variations of at least two of the plurality of process controlling means, such that the properties of the layer stack lie within predetermined tolerance values.

In a feedback system according to embodiments of the present invention, the at least one processing unit may be adapted for receiving calibration data of a nominal working point on the blank or coated substrate, and for taking this into account in determining actual values of the first layer property and of the second layer property.

A feedback system according to embodiments of the present invention may further comprise first storage means for storing calibration data of the nominal working point on the blank or coated substrate.

A feedback system according to embodiments of the present invention may further comprise second storage means for storing the layer model of the layer being applied on the substrate.

In a feedback system according to embodiments of the present invention, the monitoring device may be configured for implementing, as the other one of the first and second measurement techniques, any of a spectral transmission measurement covering at least a significant band of the visual spectrum, a spectral transmission measurement in the infrared spectrum, a non-contact measurement technique, a specular or diffuse reflection measurement, an ellipsometry measurement, a visual inspection.

In a feedback system according to embodiments of the present invention, the at least one monitoring device may comprise a plurality of first sensor elements for determining measurement signals at each of the plurality of locations spatially distributed over the coated substrate.

In a feedback system according to embodiments of the present invention, the at least one monitoring device may comprise a plurality of second sensor elements for determining measurement signals at a plurality of locations spatially distributed over the coated substrate.

In a feedback system according to embodiments of the present invention, the at least one monitoring device may be implemented as an in-situ measurement system.

The present invention further provides a feedback system according to any of the embodiments of the first aspect, implemented in a vacuum coating process which is an in-line process.

A feedback system according to embodiments of the present invention may further comprise a display device for monitoring parameters of the system. The display device comprises an input interface configured for receiving at least one process parameter, for which the vacuum coating process requires an input, and at least one substrate parameter which represents a physical property of an intermediate stack of layers; and a user interface adapted for displaying on a display device the at least one process parameter and the at least one substrate parameter, such that the influence of the at least one process parameter on the at least one substrate parameter is illustrated.

In a second aspect, the present invention provides a method for controlling properties of a single layer or multiple layer stack being applied on a blank or coated substrate by means of a vacuum coating process controlled by a plurality of process controlling means. The method comprises
providing a model of a layer being applied on the substrate, the model expressing layer parameters as a function of settings and/or variations of at least two of the plurality of process controlling means,
initiating the coating process of the single layer or multiple layer stack, by driving the plurality of process controlling means,
measuring measurement signals in a plurality of locations spatially distributed over the coated substrate, thus determining at least one measurement signal at each of the measurement locations, the measuring being by at least two distinct measurement techniques, whereby a first measurement technique is applied simultaneously to a plurality of locations, and a second measurement technique is applied to at least one location, one of the first and second measurement techniques being a spectral transmission measurement,
using the measurement signals and the knowledge from the layer model for determining actual values of at least two different layer properties at the plurality of locations, and/or for determining deviations between the actual layer property values and desired layer property values,
further driving the plurality of process controlling means in the coating process based on the determined values and/or deviations between the actual layer property values and the desired layer property values at the plurality of locations and on knowledge from the layer model, such that properties of the single or multiple layer stack being applied lie within predetermined tolerance values.

A method according to embodiments of the present invention may furthermore comprise calibrating a nominal working point on the blank or coated substrate. Determining at least two different thin film properties at the plurality of locations may then take into account knowledge from the calibrated nominal working point.

In a method according to embodiments of the present invention, both the first measurement technique and the second measurement technique are applied in-situ while the substrate moves through the vacuum deposition process.

In a method according to embodiments of the present invention, measuring measurement signals according to the other one of the measurement techniques may comprise performing a non-contact measurement technique. Measuring measurement signals according to the other one of the measurement techniques may for instance comprise performing any of a spectral transmission measurement in infrared, a non-contact measurement technique, a specular or diffuse reflection measurement, an ellipsometry measurement, or a visual inspection.

In a method according to embodiments of the present invention, driving the plurality of process controlling means in the coating process may comprise driving process controlling means having a having a different spatial impact on the layer being applied.

In a third aspect, the present invention provides the use of a method according to any of the method embodiments of the second aspect of the present invention, for controlling properties of a single layer or multiple layer stack being applied on a blank or coated substrate in an in-line vacuum coating process.

In a fourth aspect, the present invention provides the use of a method according to any of the method embodiments of the second aspect of the present invention, for controlling at least two layer properties of a single layer or multiple layer stack being applied on a blank or coated substrate. The use may be for obtaining uniformity of at least two layer properties of a single layer or multiple layer stack being applied on a blank or coated substrate.

In a fifth aspect, the present invention provides a display device for monitoring parameters of a process controlling means of a vacuum coating process and of a substrate on which a single layer or a multiple layer stack is applied by the vacuum coating process. The display device comprises an input interface configured for receiving at least one process parameter, for which the vacuum coating process requires an input, and at least one substrate parameter which represents a physical property of an intermediate stack of layers; and a user interface adapted for displaying on a display device the at least one process parameter and the at least one substrate parameter, such that the influence of the at least one process parameter on the at least one substrate parameter is illustrated. It is an advantage of embodiments of the present invention that displaying the at least one process parameter and the at least one substrate parameter of an intermediate layer stack, such that the influence of the at least one process parameter on the at least one substrate parameter is illustrated allows better controlling the vacuum coating process.

In particular embodiments, the influence of the at least one process parameter on the at least one substrate parameter may be illustrated by relating the at least one substrate parameter with the at least one process parameter in the user interface, taking into account a speed at which the substrate moves and/or a rate at which the at least one substrate parameter is influenced by the at least one substrate parameter. It is an advantage of embodiments of the present invention that an operator can readily obtain effects of process parameters on the substrate parameters during operation, under the control of a suitable user interface.

In embodiments of the present invention, the at least one substrate parameter may comprise the first layer property and/or the second layer property according to embodiments of the first aspect of the present invention.

In a sixth aspect, the present invention provides a vacuum deposition system for depositing a layer stack on a substrate. The vacuum deposition system comprises:
deposition means for depositing a sequence of layers wherein these deposition means are adapted for being controlled using a plurality of process parameters,
measurement means for measuring at least one substrate parameter of an intermediate layer stack before depositing the next layer of the layer stack,
a feedback system according to embodiments of the first aspect of the present invention, wherein the measurement means comprises at least the monitoring device and the processing unit,
and/or a display device according to embodiments of the fifth aspect of the present invention, for monitoring at least one of the process parameters and at least one of the substrate parameters.

It is an advantage of embodiments of the sixth aspect of the present invention that the formation of a layer stack on a substrate can be better controlled by introducing a feedback system and/or a display device in accordance with embodiments of the present invention. A vacuum deposition system may for example comprise a plurality of chambers which are separately controlled. It is thereby advantageous if such a system comprises a display device in which the substrate parameters in an intermediate stage may be linked with the process parameters or derived process parameters of one or more previous stages, as this allows better control of the substrate parameters. The display device may for example relate the at least one substrate parameter with the at least one process parameter based on the speed at which the substrate moves through the different chambers.

Particular and preferred aspects of the invention are set out in the accompanying independent and dependent claims. Features from the dependent claims may be combined with features of the independent claims and with features of other dependent claims as appropriate and not merely as explicitly set out in the claims.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

The above and other aspects of the invention will be apparent from and elucidated with reference to the embodiment(s) described hereinafter.

BRIEF DESCRIPTION OF THE DRAWINGS

The invention will now be described further, by way of example, with reference to the accompanying drawings, in which:

FIG. 1 shows a prior art sputtering system with an ex-situ measuring system and two in-situ measuring systems, to determine layer properties of individual layers in a layer stack.

FIG. 3 illustrates a sputtering system in which the monitoring device according to embodiments of the present invention can be implemented.

Figure 2:
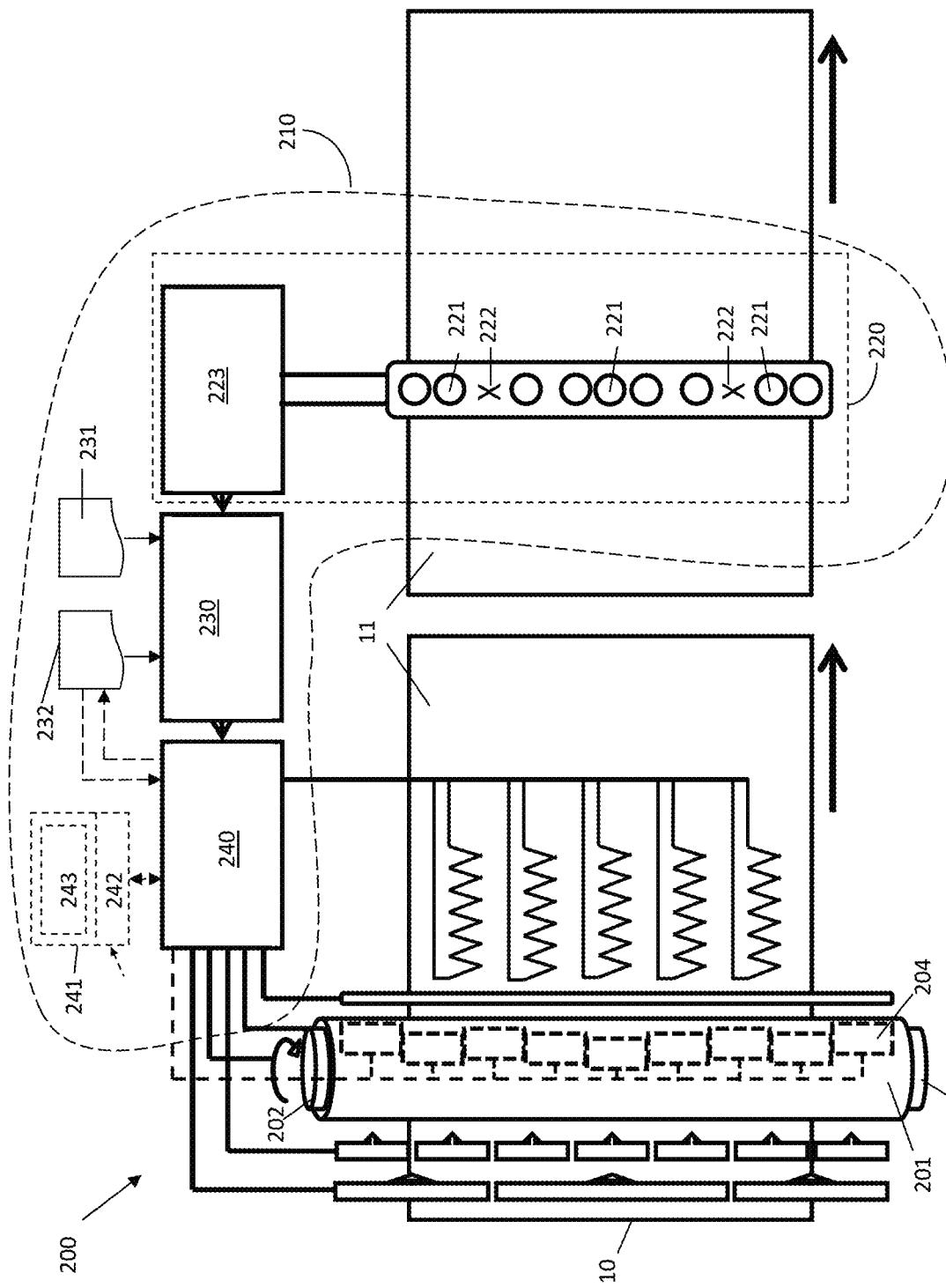
FIG. 2 schematically illustrates substrates moving under a cylindrical sputter target, and a monitoring device in accordance with embodiments of the present invention.

The drawings are only schematic and are non-limiting. In the drawings, the size of some of the elements may be exaggerated and not drawn on scale for illustrative purposes. The dimensions and the relative dimensions do not necessarily correspond to actual reductions to practice of the invention.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, directional terminology such as top, bottom, front, back, leading, trailing, under, over and the like in the description and the claims is used for descriptive purposes with reference to the orientation of the drawings being described, and not necessarily for describing relative positions. Because components of embodiments of the present invention can be positioned in a number of different orientations, the directional terminology is used for purposes of illustration only, and is in no way intended to be limiting, unless otherwise indicated. It is, hence, to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

It should be noted that the use of particular terminology when describing certain features or aspects of the invention should not be taken to imply that the terminology is being re-defined herein to be restricted to include any specific characteristics of the features or aspects of the invention with which that terminology is associated.

In the description provided herein, numerous specific details are set forth. However, it is understood that embodiments of the invention may be practiced without these specific details. In other instances, well-known methods, structures and techniques have not been shown in detail in order not to obscure an understanding of this description.

Definitions

By 'vacuum coating system' is meant a system to provide, e.g. deposit, layers of material on a solid surface (substrate). A vacuum coating system operates substantially in vacuum, i.e. at pressures well below atmospheric pressure. The provided layers can have a thickness ranging from one atom (monolayer) up to a few millimeters. Multiple layers of different materials and different thicknesses can be deposited. Vacuum coating systems include chemical vapour deposition systems, in which a chemical vapour is used as particle source, and physical vapour deposition systems, in which a liquid or solid source is used. A particular type of vacuum coating systems to which embodiments of the present invention can be applied is a sputter system.

By 'multiple layer stack' is meant a stack of multiple layers, which may differ in composition, and wherein each layer has a thickness from 1 nm to 10 µm, and typically from 3 nm to 200 nm.

An 'in-line vacuum coating process' is a process where coating can be done continuously, i.e. a substrate to be coated enters a processing chamber, is coated and leaves the processing chamber, all without the vacuum in the processing chamber having to be broken. An 'in-line measurement' in the context of the present invention is a measurement which is applied in a vacuum chamber without breaking the vacuum, as opposed to an ex situ measurement as known in the art.

Vacuum Coating Process, Process Controlling Means, Process Parameters

A sputter process, or in general a vacuum coating process, is controlled by a plurality of process controlling means. The settings of the process parameters of the process controlling means have an influence on the mechanical, optical and/or electrical properties of a layer being deposited. Some process parameters have a more global effect, while others have a more local effect. By selecting and changing a particular process parameter, layer properties may be changed, which is a desired property in terms of, on the one hand, obtaining specific properties over the complete substrate, obtaining uniformity of layer properties over a substrate, and, on the other hand, obtaining uniformity of layer properties over different substrates over time. However, a difficulty resides in that it is not easy to determine which process parameter to change, in order to achieve a particular layer property globally or locally. This is due to the fact that the influence of a first process parameter on a first layer property cannot be seen independent from its influence on a second layer property. Moreover, a particular layer property can sometimes be tuned by more than one process parameter, and without further knowledge, it is difficult to know which process parameter to amend in order to obtain a desired result in one layer property, without degrading another layer property.

Without necessarily being exhaustive, process controlling means and their corresponding process parameters are enumerated hereinafter:

Power supply: Process parameters related to the power supply are for instance the wave shape or the power level, e.g. voltage level or current level, which is related to the energy applied to the system. The power supply level is typically a global process parameter, i.e. the power supply level cannot be changed at one location only. A higher power supply level with else constant deposition parameters may for instance lead to a higher thickness. In a sputtering process, the power supply is typically hooked up to the magnetron for powering the target. However, in parallel, additional power supplies may be provided; e.g. for powering an active anode system or e.g. for powering an ion source.

Gas/liquid main supply: A process parameter related to the main gas/liquid supply is the gas/liquid flow. The gas distribution determines the location dependent partial pressure in a process chamber. The gas distribution is a complex parameter, as different gasses come into play, being pure or with various mixing ratios. The influence of the gas/liquid main supply may be confined to extend beyond the size of the delivery system inside the process chamber.

Gas/liquid reactive supply: Process parameters related to the reactive gas/liquid supply are the gas/liquid distribution and the partial pressures involved, or the gas/liquid flow rate. A higher reactive gas flow will typically generate a lower sputtering rate. By changing the reactive gas flow, the thickness of the layer being deposited can be controlled; however, also its composition and performance may be influenced. The influence of the gas/liquid reactive supply may be confined to extend slightly beyond the size of the delivery system inside the process chamber.

Target: A process parameter related to the target, is the target movement, e.g. speed of rotation.

Magnetron: Process parameters related to the magnetron are for instance magnetic field strength, magnet movement, or speed of rotation. Magnet movement includes magnet bar orientation and magnet bar position. The magnet bar position determines the plasma density, hence the sputter rate. Especially if the magnet bar consists of a plurality of magnet bar sections, the influence of the magnet bar is local. A stronger local magnetic field yields a higher local sputter rate.

Anode: A process parameter related to the anode is the anode tuning level; e.g. the resistance to ground level. Anode tuning is a global parameter.

Heating: A process parameter related to heating is a temperature level. Heating has a local influence, as different temperatures can be applied at different locations.

FIG. 2 illustrates an inline vacuum coating system in the form of a sputter system 200 according to an embodiment of the present invention, for instance a sputter system for sputtering large area surfaces, such as large area substrates or arrays of smaller substrates.

The sputter system 200 is configured for sputtering one or more material layers onto a substrate 10. The substrate may be any underlying solid layer. It may for instance be a blank substrate, i.e. a substrate of bare material, or a substrate of substrate material which in itself is already covered by one or more material layers. In the case of sputter depositing one or more material layers onto the substrate, the sputter system 200 comprises at least one target 201, for instance in the embodiment as illustrated in FIG. 2 at least one cylindrical target 201; the present invention, however, not being limited to a particular type of vacuum deposition, let alone to a particular type of sputtering. The at least one cylindrical target 201 may be affixed to at least one end block (not illustrated in FIG. 2) at the interface 202, 203. Rotation of the at least one cylindrical target 201 around its rotational axis may be driven by first drive means. A magnet bar 204 may be provided inside the cylindrical target 201. The magnet bar 204 may be an integral magnet bar of a single section, or may comprise, as illustrated in FIG. 2, a plurality of magnet bar sections, which are individually drivable, actuated by second driving means, towards and away from the target axis, and hence away from and towards the target surface. The magnet bar 204 may be rotatable around the target axis, for instance driven by third drive means. Driven by the third drive means for rotation around the target axis, the magnet bar 204 may undergo for instance a wobbling movement.

In a sputter system 200 according to embodiments of the present invention, a plurality of sputter zones 300a, 300b, 300c, 300d may be provided, where at least one target 201 (cylindrical in the embodiment illustrated, but the invention not being limited thereto) is provided in each sputter zone. This is illustrated in a side view in FIG. 3. Typically, a sputter system 200 may comprise at least five, e.g. at least fifteen, e.g. at least up to even fifty or more sputter zones 300x. Such a sputter system is ideally suited for production campaigns containing a variety of products, each with a specific coating stack that includes a relatively large number of layers, e.g. at least three, at least six, or e.g. at least ten or e.g. at least fourteen, or even more than fourteen coating layers. Pump zones P may also be provided, typically for separating different target materials, or different layers or different processes.

Prior art vacuum coating systems may comprise an ex situ sensor system 301 to measure properties of the entire coating layer stack. This is usually a traversing system, in which a measuring head can move across the width of the substrate. In known systems, typically the degree of reflection and color are measured and verified, but such a measuring system does not allow the individual layer thicknesses of the layers in the coating stack to be determined therefrom. Provided use is made of spectral measurement data from the ex situ measuring system and a computer system with a software package for optical modeling, the most likely actual layer thickness of each deposited layer can only be calculated by approximation, based on the process controlling parameters of the coating stack to be produced and based on the known material properties. The uncertainty increases as the coating stack contains more layers and/or as the measuring accuracy decreases. In order to obtain a higher accuracy of the properties of individual layers, and thus of the complete stack, in the prior art devices, other techniques must be used, such as destructive testing (e.g. by etching away certain layers), resulting in large time delays, which is not practicable for production campaigns containing a variety of products each having a unique coating stack. Consequently, the adjustment of the sputtering zones (e.g. based on adjustment of process controlling means) is not easy. If one also wishes to check the layer properties and their uniformity over the surface of the substrate, the number of measurements and the preparation of the samples will very rapidly increase. Furthermore, if the coating stack is thick or is containing many layers, the substrate may reside in the vacuum systems for many minutes. If a deviation in the stack occurs in one of the first layers close to the original substrate, the delay of noticing this effect from the ex-situ sensor system may be significant. As a result, a significant volume of product may already be of sub-optimal quality and it is hard for feeding back to the deviating layer process controlling means because of the time lag.

In order to increase the quality of the coating stack, the vacuum coating system according to embodiments of the present invention, one example thereof being illustrated in FIG. 2, comprises a feedback system 210 for controlling properties of a single layer or of a multiple layer stack having been applied on a substrate 10, for instance a blank substrate or an already previously coated substrate. The substrate 10 (blank or previously coated) together with the freshly applied coating (single layer or multiple layer stack) forms what is further called the coated substrate 11.

The feedback system 210 comprises at least one monitoring device 220 for determining measurement signals. The monitoring device 220 is configured as an in-situ measurement system, meaning that measurement of a layer is made possible after the layer is formed on the substrate, while the substrate moves through the vacuum deposition device. Measurements are performed in real-time, such that correction for deviations in the layers can be done in real-time.

The monitoring device 220 is configured for implementing at least two distinct measurement techniques for determining measurement signals. The distinct measurement techniques are such that different information is, i.e. different layer properties are, obtained out of the measurement signals, such as for instance information about mechanical properties like layer thickness or layer roughness, information about optical properties like reflectance or transmittance, or information about electrical properties like resistivity. While distinct measurement techniques may have a completely different way of measuring; some of the distinct measurement techniques might be closely related, such as for example transmission measurements in an infrared wavelength band and transmission measurements in the visual spectrum, or transmission measurements under different angles. Important is that the distinct measurement techniques are selected so as to provide information on different layer properties.

The measurement signals are obtained at each of a plurality of locations spatially distributed over the coated substrate 11. A first measurement technique is adapted for being applied simultaneously to a plurality of locations, and a second measurement technique is adapted for being applied to at least one location. This means that, in embodiments of the present invention, both the first and the second measurement technique may be applied to a plurality of locations. A measurement over a plurality of locations provides position-dependent information. This allows seeing whether the deviation of a material property is a local or a global deviation. In the first case, a process controlling means having a local influence should be actuated differently, while in the second case the actuation of a process controlling means having a global influence should be adapted. The at least one location where the second measurement technique is applied may be one of the locations where also the first measurement technique is applied. Alternatively, the at least one location where the second measurement technique is applied may be a location where no other measurement techniques are applied.

One of the first and second measurement techniques is a spectral transmission measurement. The other one of the first and second measurement techniques can be any other suitable measurement technique, such as for instance a transmission measurement, e.g. also a spectral transmission measurement, but in another wavelength band; a reflection measurement; ellipsometry (measuring a change in transmitted or reflected polarization); a non-contact measurement technique such as a Hall probe or Eddy current technique; a camera imaging technique with light field or dark field illumination, specular or diffuse reflection on the substrate side or coating side, etc.

To implement the distinct measurement techniques, the monitoring device 220 may comprise a plurality of sensor elements 221, 222. In the embodiment illustrated in FIG. 2, a plurality of first sensor elements 221 are provided, for implementing the first measurement technique; and two second sensor elements 222 are provided, for implementing the second measurement technique. In the embodiment illustrated, the second sensor elements 222 are distributed amongst the plurality of first sensor elements 221, but the present invention is not limited thereto. In alternative embodiments, a single second sensor element 222 could be provided, and this single second sensor element could be located either in between two first sensor elements 221, or adjacent the plurality of first sensor elements 221, or even at a completely different location.

The monitoring device 220 may also comprise a sensor controller 223, for receiving, possibly storing, and transmitting the measurement signals obtained from the individual sensor elements 221, 222. The sensor controller 223 may already process or pre-process data; e.g. for visualizing the raw data in a graph or table or e.g. for filtering, averaging or comparing data with reference results. Furthermore, the sensor controller 223 may reset, start-up, calibrate, screen settings or in any way control the functionality of the sensor elements. The sensor controller 223 as illustrated in the embodiment of FIG. 2 is a separate controller, but according to embodiments of the present invention, the functionality of the sensor controller could be implemented by any other processing unit, combined with other types of processing. The different types of processing may be implemented as interconnected and separately running modules.

The feedback system 210 furthermore comprises at least one processing unit 230. The processing unit 230 is adapted for receiving the measurement signals, either from the sensor controller 223 or directly from the sensor elements 221, 222 if no separate sensor controller is available. The processing unit 230 is furthermore adapted for receiving calibration data of a nominal wording point on the blank or previously coated substrate 10, which calibration data may be stored in a first storage means 231. The calibration data may include substrate characteristics and process variables. The processing unit 230 may furthermore be, but does not need to be, adapted for receiving knowledge from a layer model of the layer being applied, the layer model expressing layer parameters of the layer being applied as a function of settings and/or variations of at least two of a plurality of process controlling means. The layer model may be stored in a second storage means 232.

The processing unit 230 is configured to determine, from the calibration data and the measurement signals, actual values of at least two different thin film properties at the plurality of locations. The processing unit can compare the actual values of the at least two different thin film properties at the plurality of locations to corresponding desired values.

If the processing unit 230 is adapted for receiving knowledge from a layer model of the layer being applied, the processing unit 230 may use this knowledge to convert the difference between the actual values of the different thin film properties and the desired values at the plurality of locations into signals which may be used for generating actuation signals for actuating the plurality of process controlling means.

The feedback system 210 furthermore comprises a controller 240 adapted for receiving signals from the processing unit 230. In case these signals are values representative for the deviation between the actual values of the at least two different thin film properties at the plurality of locations, and the corresponding desired values, the controller 240 may be adapted for receiving knowledge from the layer model of the layer being applied, and may be configured for using this knowledge to convert the difference between the actual values of the different thin film properties and the desired values at the plurality of locations into signals which may be used for generating actuation signals for actuating the plurality of process controlling means. In the alternative embodiment where the knowledge from the layer model is applied to the processing unit 230 as set out above, the comparison between the actual and the desired values of the thin film properties has been made in the processing unit 230, and the controller 240 is adapted for receiving signals for use in the generation of actuation signals for the process controlling means. In any case, the controller 240 generates, based on the input data received, actuation signals for actuating the plurality of process controlling means. Hereto, the controller 240 not only generates control signals for driving the process controlling means, but it also generates further control signals to further drive the plurality of process controlling means, such that the vacuum coating process is carried out with different process parameters, so as to bring the properties of the layer of layer stack within predetermined tolerance values.

In particular embodiments, information of current actuator settings, known to the controller 240, may provide essential input to the layer model for understanding the sensitivity of the actuators close to the regime of their actual working point. As an example only, if the magnetic field strength is high; a small change in magnet position may generate a large effect on field strength, while the same actuator movement for a weak magnetic field may cause a smaller effect on field strength. So, in fact: the model stored in the second storage means 232 may be using input from 240, and may provide input to either processing unit 230 or to controller 240. If the feedback system of the present invention is implemented on an existing system vacuum coater, the second storage means will most probably be functionally coupled to the processing unit 230, as this requires the least amendments to the existing bits and pieces. If, however, a completely new vacuum coater is built, implementing the feedback functionality according to embodiments of the present invention, coupling of the second storage means 232 to either one of the processing unit 230 or controller 240 is a design choice.

The sensor controller 223, the processing unit 230 and the controller 240 are illustrated in FIG. 2 as separate devices. This is for sure one possible implementation of the present invention, but the invention is not limited thereto. Any combination of sensor controller 223, processing unit 230 and/or controller 240 may by be incorporated as modules of a same software or hardware platform. For instance, the signal handling software module may be part of or being shared with the processing unit 230. In fact, if e.g. controller 240 is already present on a coating system, sensor controller 223 and processing unit 230 may be physically two separate units or one single unit. If they are one physical unit, the processes of the sensor controller 223, the processing unit 230 and even the controller 240 may be combined, modular or running on the same or multiple separate logical processors. In alternative embodiments, the processing unit 230 and the controller 240 can be integrated in a single component embodying the functionality of both the processing unit 230 and the controller 240, e.g. determination of layer properties from the measurement values, identification of whether particular layer properties deviate from a desired value, and if so identification of which process parameters need to be changed to obtain the desired layer property values.

It is important to realize that the feedback given by the processing unit 230, by comparing the actual layer property values with the desired layer property values, may potentially act on a plurality of process controlling means, i.e. obtaining a desired layer property value can be achieved in different ways. Selecting the right process parameter to be changed, by providing the corresponding actuation signals for actuating the process controlling means, such that substantially uniform layer properties are obtained, is a difficult task, as changing a particular process parameter to improve a particular layer property might deteriorate another layer property.

FIG. 2 also schematically shows a display device 241 for monitoring parameters of the process controlling means of the vacuum process in combination with a representation of data retrieved from the monitoring device. This display device 241 comprises an input interface 242 configured for receiving at least one process parameter, for which the vacuum coating process requires an input, and at least one substrate parameter which represents a physical property of an intermediate stack of layers. The input interface 242 may retrieve its information from different components of the sputter system 200, i.e. the input interface 242 may retrieve system generated inputs. It may for example retrieve its information from the monitoring device 220, and/or from the sensor controller 223, and/or from the processing unit 230, and/or from the first 231 or second 232 storage means, and/or from the controller 240. The input interface is, however, not limited thereto. It may for instance also retrieve operator inputs. A combination of operator inputs and system generated inputs may also be received by the input interface 242. For instance, the operator may have chosen an option to automatically adjust the system settings, once the processing unit is able generating reliably adequate process settings On top of this option, or alternatively, an operator input, e.g. in case of emergency, may overrule any system generated input.

The display device may also comprise a user interface 243 adapted for displaying on a display device the at least one process parameter and the at least one substrate parameter, such that the influence of the at least one process parameter on the at least one substrate parameter is illustrated. The user interface 243 may display derived process parameters, which are linked with actuation settings; e.g. the actuator may set the gas flow from a mass flow controller and the resulting pressure in the chamber is being measured as process parameter. It is to be understood that the resulting pressure measurement may further depend e.g. on chamber temperature, pumping speed, valve settings, etc. and other related actuator settings or system conditions.

Examples of such a display device, in accordance with embodiments of the present invention, will be described later in the description.

In accordance with embodiments of the present invention, a layer model is provided for aiding in accomplishing this task. The layer model provides the intelligence to adjust the actuation of the process controlling means so that the desired layer properties are obtained.

Model

The layer model expresses layer parameters of the layer being applied as a function of settings and/or variations of at least two of a plurality of process controlling means. Such model can be built in any suitable way, such as for instance by experiments, by means of by machine learning, e.g. artificial intelligence or deep learning.

Building a model by experiments would mean that, in an n-dimensional space, n being the number of process parameters, e.g. power supply level, main gas flow, reactive gas flow, target movement, magnet bar movement, anode tuning level, temperature level, one sets different values for the plurality of process parameters, and measures the different layer properties for each set of values. Well-known techniques to do this are full factorial or partial factorial design-of-experiments. In a full factorial design-of-experiment, each of the n process parameters take on a discrete number of possible values, and for all possible combinations of these values, the layer properties are measured. By doing this, the effect of each process parameter on any of the layer properties becomes clear. If the number of combinations in a full factorial experiment is too high to be feasible, a partial factorial experiment may be carried out, in which a plurality of the possible combinations are omitted. These experiments may be done a priori (i.e. before controlled production is started) or in situ (i.e. while controlled production is running). In the latter case, small and controlled variations may consistently be implemented on the process parameters and their effect or impact on the measurements or layer properties are being monitored. In the latter case, the fluctuations should be sufficiently small not to affect the desired performance of the coating and keeping the layer properties within the specification window. This method allows for constantly checking the actual sensitivity of the process parameters on the layer properties, while these may be shifting over the length of a production campaign or lifetime of the involved parts (e.g. thickness of the target material).

The end result of the model building step is at least one model which expresses layer parameters as a function of settings and/or variations of a plurality of process controlling means, often represented by the response surface methodology. The end result may be one single model incorporating values for all layer properties in function of all process controlling means settings. Alternatively, the end result may be a plurality of models, where each model expresses values for a single layer property in function of all process controlling means settings. Yet alternatively, the end result may be a plurality of models, where each model expresses values for a plurality of layer properties in function of all process controlling means settings. Each of the involved models may be based on experimental work or on physical relationships being described and proven with mathematical formulas. For example, constructive and destructive interference may provide fringes on the transmittance and reflectance spectrum, allowing for calculating the optical thickness of a layer from the position of the extrema. Furthermore, several models are available and being used in software packages for thin film design and analysis providing calculation of optical constants for a layer on a substrate.

The model learns to the user what the sensitivity of a layer property to particular process parameters is. It turns out that there is a cross-correlation between different process parameters and layer properties.

How to Use the Model

In a practical situation, it will be desired to deposit a layer onto a substrate, by means of a vacuum coating device. The layer needs to have particular, desired, properties, such as for instance a particular resistivity, transmission, roughness and/or thickness. The vacuum coating device will be actuated by actuation signals, of which determining the values lies within the skills of a person skilled in the art.

It turns out, however, that the deposited layer does not always have the desired properties. This may be due to a slightly changed environment, to ageing of the vacuum coater, to heating of the vacuum coater, to material being deposited on some components of the vacuum coater such as walls of the vacuum chamber or holes of the gas distribution system, to degassing out of porous walls, to target erosion causing an increase of magnetic field strength, etc. which may all cause drifting of one or more process parameters. It is an object of the present invention to provide a solution to this problem, and to drive the coating system in such a way that, in the end, the layer being applied has the desired properties with good repeatability and reproducibility.

Hereto, in accordance with embodiments of the present invention, a feedback system is provided, for measuring at least two measurement values, by at least two distinct measurement techniques, of which one is a spectral transmission measurement. As an example, the present invention not being limited thereto, two transmission measurements may be carried out, one in the infrared wavelength band, and one in the visual wavelength band. One of the measurements is carried out at a plurality of locations, while the other measurement is carried out at at least one location. Both measurements may be carried out at a plurality of locations.

The measurement values may be used in a method according to embodiments of the present invention. The method may be implemented in software.

From the measurement values, material layer properties are determined. In case of the example of two transmission measurements, the resistivity p of the layer being applied can be determined from the first transmission measurement in the infrared wavelength band, while the thickness d, the refractive index n and the absorption coefficient k can be determined from the second transmission measurement in the visual wavelength band. Of course, if other material layer properties need to be determined, other measurement techniques can correspondingly be used.

In accordance with embodiments of the present invention, at least one measurement is a measurement which is applied simultaneously at different locations, which provides position-dependent information. This allows seeing whether the deviation of a material property is a local or a global deviation, and hence whether a process controlling means having a local influence or having a global influence should preferably be actuated differently.

Imagine for instance that, for a particular application, layer thickness and resistivity are of utmost importance to have a uniform value. Layer thickness can be influenced by e.g. changing the power supply level (global influence) and/or by changing the gas/liquid reactive supply flow (global or local influence, depending on whether the reactive supply flow is changed everywhere, or only at one or more locations) and/or by tuning the magnet bar (local influence), etc. The measurement which provides the layer thickness information should preferably be a measurement which also provides the positional information. Resistivity can be influenced by e.g. the gas/liquid main supply flow (global or local influence) and/or by changing the power supply level (global influence) etc. As the power supply level has an influence on both thickness and resistivity, intelligent decisions need to be taken in order to get to the desired material properties.

From the layer model, which expresses layer parameters of the layer being applied as a function of settings and/or variations of a plurality of process controlling means, it can be identified for each of the process parameters involved in the control of the coating process which sub-ranges can be taken on to get the first layer property, e.g. thickness, within a tolerance range around the desired first layer property value. Depending on whether the layer property has been determined from a measurement at a single location, or from a plurality of simultaneous measurements at different locations spatially spread over the substrate, it may make more sense to differently actuate process controlling means having a global influence or a local influence. It will become clear from the model that some of the process parameters do not have a lot of influence on the first layer property, which implies that for these process parameters the allowable sub-range is very large. If the particular process parameter does not influence the first layer property at all, the particular process parameter can take on any value. A first set of sub-ranges of process parameters is thus obtained.

Similarly, from the layer model it can be identified for each of the process parameters involved in the control of the coating process which sub-ranges can be taken on to get the second layer property, e.g. resistivity, within a tolerance range around the desired second layer property value. A second set of sub-ranges of process parameters is thus obtained.

In accordance with embodiments of the present invention, the process parameters to be set are then selected from within the section of the first and second sets of sub-ranges of process parameters. This means that for each process-parameter, a value is selected which makes both the first layer property and the second layer property fall within its tolerance range.

If no common values of process parameters can be found in the section of the first and second sets of sub-ranges, the tolerance ranges of one or more of the layer properties should be made a bit more lenient or the layer stack design might be questioned. If plenty of common values of process parameters can be found in the section of the first and second sets of sub-ranges, the tolerance ranges of one or more of the layer properties can be made more strict.

Actuation signals are generated based on the selected common values of each of the process parameters, for application to the corresponding process controlling means. These actuation signals may be electrical signals such as voltages or currents.

EXAMPLE

Let us take a real example of the most important TCO (Transparent Conductive Oxide) material, being ITO (Indium Tin Oxide). The key layer properties of a TCO material are, as the name suggests, having sufficiently high transmittance in the visual spectrum and having sufficiently low electrical resistance. ITO in particular has a relatively well known performance of layer properties for a variation in process condition means so that we may directly implement a layer model from information that has been published for sputter depositing this material from a ceramic ITO target. The monitoring device consists of 2 measurement techniques. For bringing the example to its essence; let's assume that we conduct 2 transmittance measurements over the visual spectrum and in between we perform a contactless Eddy current measurement for measuring the resistance. Assume that the desired layer properties predict that the transmittance should be kept above a certain threshold; e.g. average above 84% in a range between 500 nm and 600 nm, while the sheet resistance R☐ should be kept below 170 Ω/☐.

From literature, we know that typically:
Higher layer thickness D will reduce the sheet resistance
Higher layer thickness D will reduce the transmittance
Higher reactive oxygen flow O will increase the sheet resistance
Higher reactive gas flow will O increase the transmittance
Higher magnetic field strength B will reduce the sheet resistance
Higher magnetic field strength B will increase the transmittance
Higher temperature T will reduce the sheet resistance
Higher temperature T will increase the transmittance The sensitivity of each effect is not linear and some may even pivot to the opposite impact effect after passing an extreme.

Let us show a possible scenario of the evolution of the monitoring device, the processing unit and controller over time:

| Time | Left (T %) | Middle R☐ (Ω) | Right (T %) | Processor | Controller |
|---|---|---|---|---|---|
| 0 | 85 | 160 | 86 | OK | No action |
| 1 | 83 | 140 | 85 | D up overall or over oxide overall | Power down |
| 2 | 85 | 160 | 86 | OK | No action |
| 3 | 83 | 160 | 87 | D up left or under oxide left | B down left because T right is up as well |
| 4 | 85 | 160 | 86 | OK | No action |
| 5 | 83 | 150 | 86 | D up left or under oxide left | O up left because R middle is down as well |
| 6 | 85 | 160 | 86 | OK | No action |
| 7 | 85 | 180 | 86 | D down middle or over oxide middle | O down middle because rest is stable |
| 8 | 85 | 160 | 86 | OK | No action |

The example above is simplified on purpose, as to show algorithm scenarios of the layer model involving the need for only regulating a single process controlling means. Furthermore, transmittance measurements may involve interference fringe analysis coupled with optical thin film software for determining layer thickness, refractive index and extinction coefficient. The example above is limited to a simple transmittance threshold analysis for estimating layer thickness. In addition, in the example above, regulation is limited to only three process controlling means: power level, local magnetic field tuning and local reactive gas flow tuning. The tuning sensitivity may depend on the current working point and on the coater condition (e.g. target lifetime, contamination level . . . ) and is not detailed in this example either.

Important to note is the importance of having at least 2 distinct measuring techniques and having a spatial distribution. In the example at Time 1, 3 and 5; the T (%) measurement at the left side goes out of specification to exactly the same value. Because of the intelligence of the layer model interpreting the derived layer properties from the other measurement results in parallel, for the three cases; different scenarios are being implemented and the controller actuates different process controlling means for bringing the process back to the predetermined acceptable tolerance window. Having only a single measurement would not allow bringing the process back to its desired regime.

While the invention has been illustrated and described in detail in the drawings and foregoing description, such illustration and description are to be considered illustrative or exemplary and not restrictive. The foregoing description details certain embodiments of the invention. It will be appreciated, however, that no matter how detailed the foregoing appears in text, the invention may be practiced in many ways. The invention is not limited to the disclosed embodiments. For example, in the embodiment illustrated in FIG. 2, only one target 201 is shown, and only one monitoring device 220. In embodiments of the present invention, a plurality of targets could be provided, one after the other, each depositing a different layer onto the substrate. Individual monitoring devices can be provided in-line, in between two neighboring targets, feeding back measurement signals for adapting the settings of the previous target so as change the layer being deposited by the previous target. Alternatively, a monitoring device can be provided in-line, feeding back measurement signals for adapting the settings of more than one previous target so as to change the layers being deposited by these plurality of targets. In the embodiment illustrated in FIG. 3, a plurality of in-line monitoring devices 421, 422 are provided, where monitoring device 421 may for example feedback measurement signals to adapt settings for the targets of sputter zones 300*a* and 300*b*, while monitoring device 422 may feedback measurement signals to adapt settings for the target of only sputter zone 300*c*. The targets do not need to be cylindrical targets, but can also be planar targets.

The deposition system does not need to be a sputter system, but can be any other vacuum deposition system, even complex hybrid vacuum coating processes such as family of CVD (e.g. PECVD or ALD), family of PVD (e.g. ion assisted deposition, HiPIMS, arc evaporation), or a combination of these.

In the embodiments previously described, the sputter system was an in-line sputter system. Also this is not intended to be limiting for the present invention. A further example, for instance illustrated in FIG. 4, implements the basics of the present invention in a batch coater 40. The batch coater 40 has a drum 41 rotating around an axis and having a chamber wall 42 surrounding the rotatable drum. On the chamber wall 42, several material deposition sources 43, in the embodiment illustrate two with cylindrical targets and two with planar targets, may be placed. Each material deposition source 43 extends along the chamber wall 42 in a direction parallel to the drum rotation axis. In fact, these material deposition sources 43 could be an array of small sources adjacent one another, each having a separate power supply as well (making the power supply a local variable and not a global one). On a certain zone 44 of the chamber wall 42 a longitudinal monitoring device 45, 48 may be positioned for monitoring the layer growth, which monitoring device 45, 48 forms part of a feedback system according to the present invention, of which the other parts are not shown in order not to overload the drawing. The monitoring device 45, 48 allows implementing at least two distinct measurement techniques for determining measurement signals at each of a plurality of locations spatially distributed over the coated substrate, whereby a first measurement technique is adapted for being applied simultaneously to a plurality of locations, and a second measurement technique is adapted for being applied to at least one location, one of the first and second measurement techniques (the one making use of the light source 46) being a spectral transmission measurement.

Figure 4:
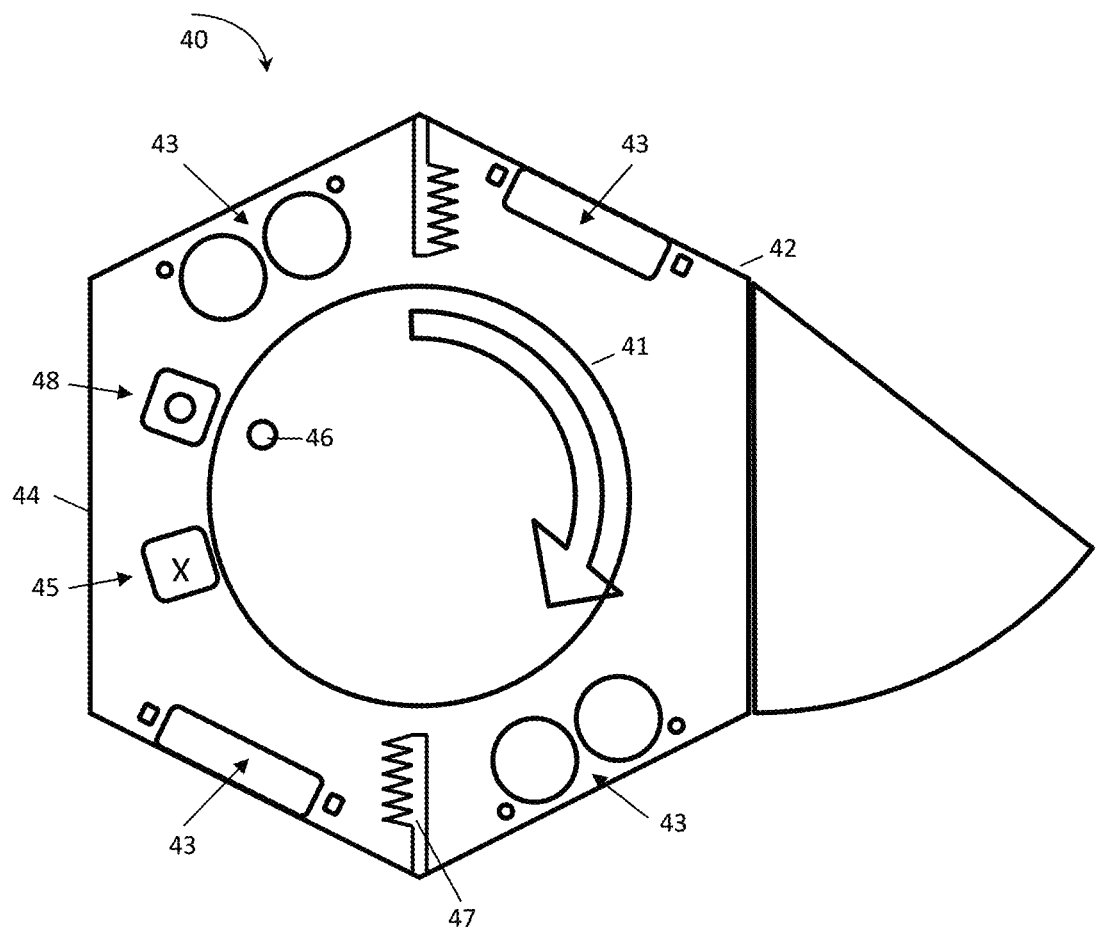
FIG. 4 illustrates a top view of a batch coater according to embodiments of the present invention.

As an example, in such set-up, a desired layer stack to be deposited may be a Fabry Perot filter with many layers of alternating high and low refractive index material. In the coater 40, at least one source is present that is able to produce the high and low refractive index material, e.g. a Si target under oxygen gas (low n) and under nitrogen gas (high n). Preferably, two different sources under similar gas ambient are provided, each with the same or different process control parameters, one of which deposits the low n and one depositing the high n material. The drum 41 constantly rotates and sequentially one process is run followed by the other process; the total stack may have only 2 layers or more: e.g. 3 or 6 or 20 or 100 or even still more. The batch coater 40 illustrated in FIG. 4 is showing four sources: these may be sputter sources, general PVD sources, CVD sources or layer activating sources (e.g. ion sources; not depositing a layer, but altering the morphology or composition of the layer). Several sources may be the same or similar; e.g. the sources illustrated by circles in FIG. 4 may be depositing the low n material (e.g. cylindrical Si targets in oxide mode), while the rectangles may be depositing the high n material (e.g. planar Nb targets in oxide mode), while the resistor symbol 47 may be an oxide activation source or a heater or an ion source or a bias source in the chamber or on the substrate; all of which are covered by the process controlling means. In accordance with embodiments of the present invention, during each layer (at least one revolution of the drum, more preferably many revolutions of the drum) the monitoring devices may adjust and correct while the layer is being built or may adjust for at least one of the upcoming layers to be deposited in the multi-layer stack.

Figure 5:
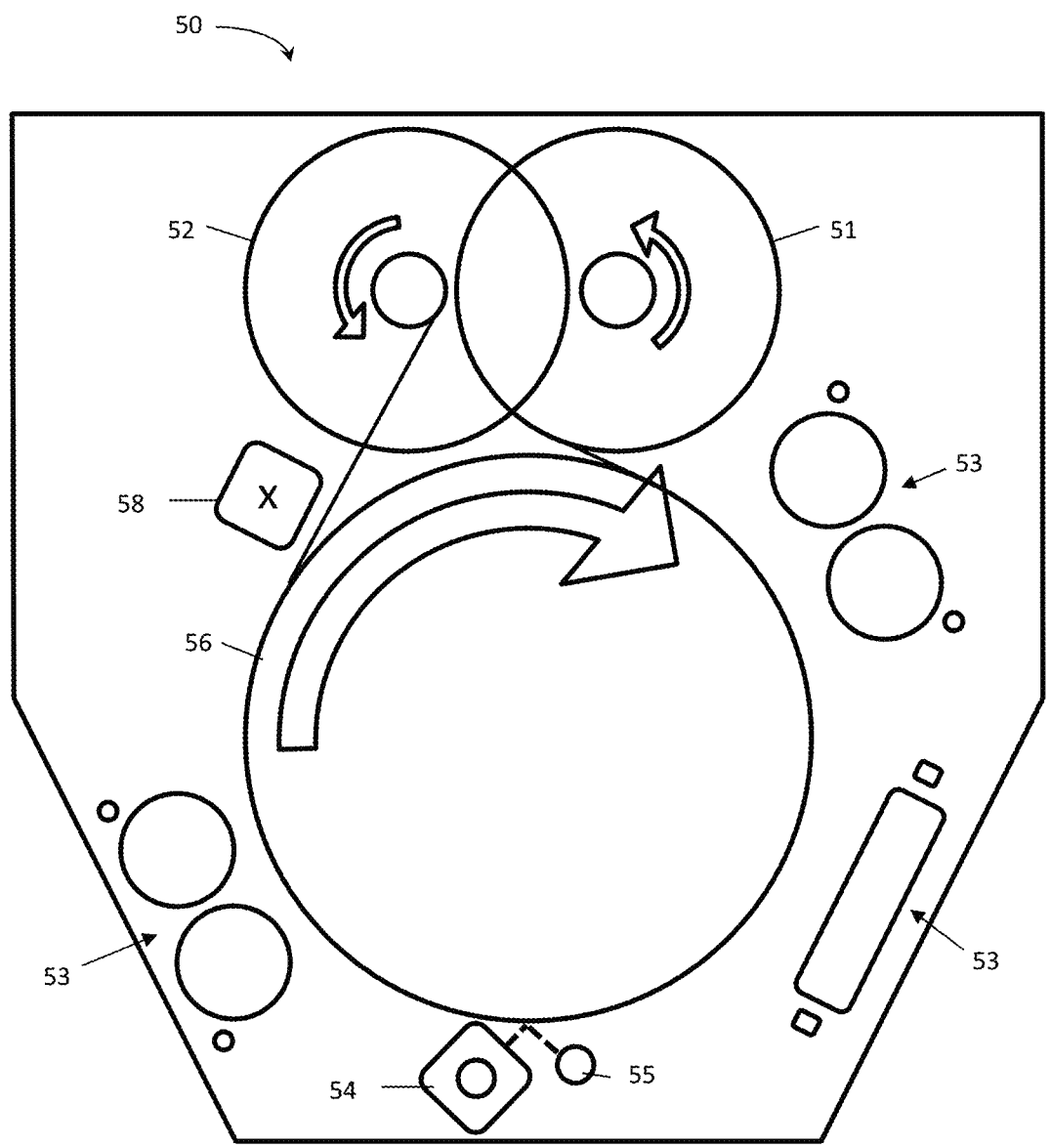
FIG. 5 illustrates a side view of a roll-to-roll web coater according to embodiments of the present invention.

Yet alternative embodiments include web coaters 50, as for instance illustrated in FIG. 5. A web coater may be understood as a batch coater: i.e. it is opened to load a substrate (being a roll 51 of flexible material; e.g. PET) and is opened again after the coating cycle to remove the substrate (coated roll 52 of material), before putting in a new roll 51. During operation, the roll 51 is decoiled, the flexible substrate passes along the deposition sources 53, possibly over a large cooling drum, and may subsequently pass along a monitoring device 54, 58 before further processing or before rewinding on a receiving spool 52. In the vacuum system, the flexible substrate is being treated and coated. Treatment may cover a degassing step (heat treatment) or surface activation step (plasma treatment); coating may cover any single or multiple PVD and/or CVD and/or vacuum coating process. Each of the sources (treatment and coating) is being covered by the process controlling means and contributes to the performance of the layer properties (e.g. a surface activation plasma pre-treatment may help in improving the adhesion of the coating onto the substrate). The monitoring device 54, 58 allows implementing at least two distinct measurement techniques for determining measurement signals at each of a plurality of locations spatially distributed over the coated substrate, whereby a first measurement technique is adapted for being applied simultaneously to a plurality of locations, and a second measurement technique is adapted for being applied to at least one location, one of the first and second measurement techniques (the one making use of the light source 55) being a spectral transmission measurement.

The transmittance measurement in a web coater may have two different set-ups: light source and detector are at opposite sides of the substrate, or light source and detector are at the same side of the substrate and reflection from a polished surface is being used for evaluation the double transmittance and having a superimposed reflection measurement as well (applicable in the non web coating applications as well). Indeed, there may be locations where it is not possible to illuminate the substrate from the backside, as such flexible substrate is guided over a large polished cooling drum (polishing is important for having good thermal contact between drum and substrate). The shiny drum may act as a reflector. Using a light source 55 at the same side of the substrate as the detector side and using specular reflection on the drum allows measuring double pass transmission (from the light source 55, through the substrate, reflected on the drum 56, passing through the substrate again, and captured by the sensor) on top of reflection.

Figure 6:
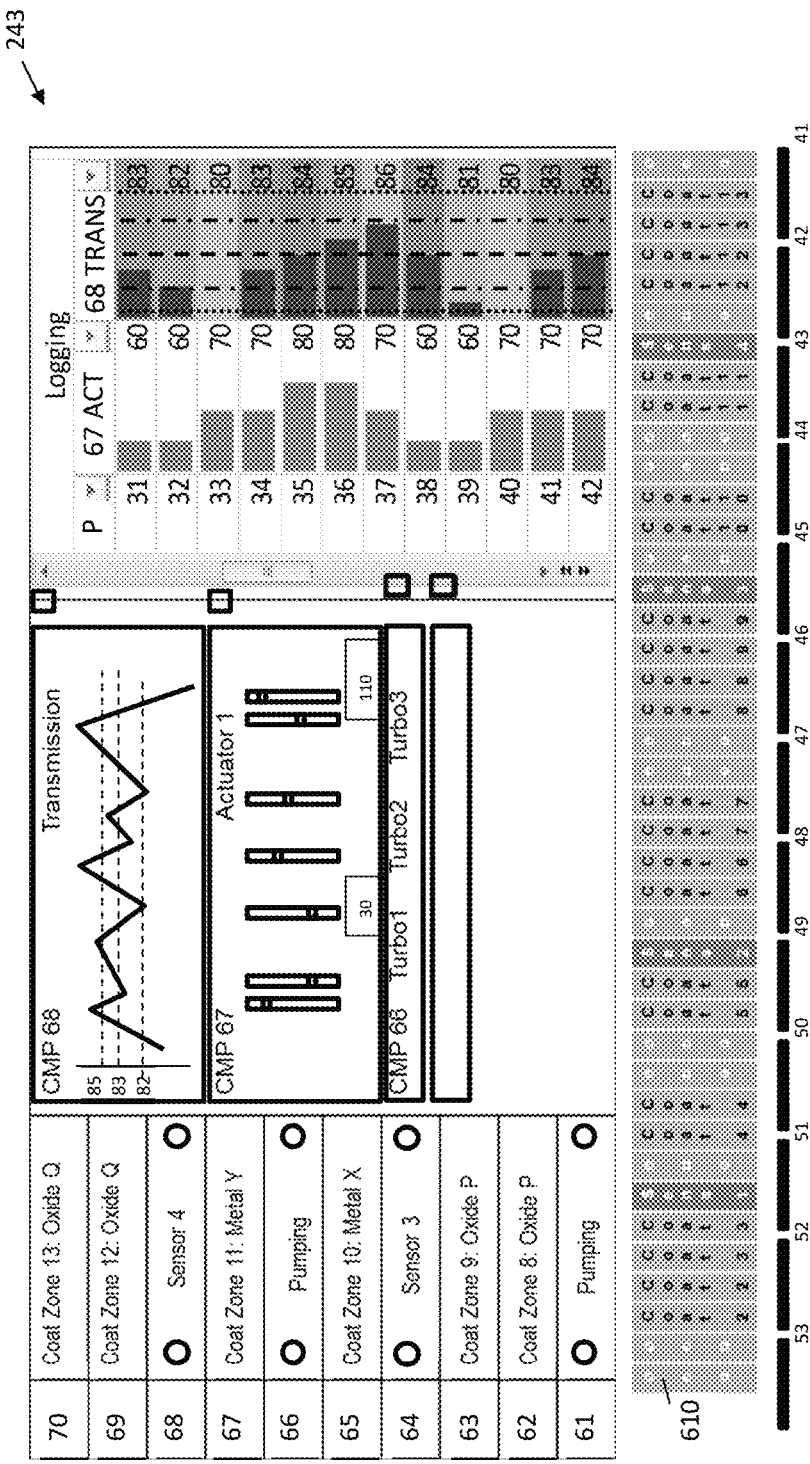
FIG. 6 and FIG. 7 show possible screen shots of a user interface of a display device in accordance with embodiments of the present invention.

FIG. 6 shows a possible screen shot of a user interface 243 of a display device in accordance with embodiments of the present invention. The invention is not limited to the layout neither to the parameters shown.

The bottom of the screen shows a representation of substrates, e.g. glass panes, moving along the various compartments (CMP) of a coater. This coater is adapted for executing the different steps of a vacuum coating process. In this example the panes are numbered from 41 to 53 and they are moving from left to right through the coater. The view may for example be an animated view of moving bars and/or identification numbers of the panes. During operation the panes may for example be moving at a speed of 5 m/min. As shown in the screen shot, a single glass pane may stretch over several compartments at the same time. The different compartments or coat zones are also shown in the bottom of the screen. In this example coat zones 2 until 13 are shown. In this example each compartment is represented by two blocks. This may for example be done to separate the settings of individual targets in a dual AC configuration within one compartment. These coat zones are alternated with sensor elements (sense 1-4) and with pumping elements 610. Using the sensor elements it is possible to obtain substrate parameters, which represent a physical property of an intermediate stack of layers. A sensor element may be positioned next to a pumping element to allow a cleaner environment for the sensing element.

The left of the screen shows a zoomed in version of the coat zones, sensing elements and pumping elements at the bottom of the screen.

The middle of the screen shows more details of process parameters (process controlling means/actuators and process conditions). In this example the middle of the screen shows process parameters of actuator 1 in coat zone 11 (CMP 67) and substrate parameters of sensor element 4 (CMP 68). The middle of the screen also shows substrate parameters. A delayed version of the substrate parameters may be shown such that the influence of the process parameters on the substrate parameter is illustrated. The representation may thereby be such that a correlation and significance between on the one hand process control means or process parameters and on the other hand substrate parameters is illustrated. The substrate parameter may for example have a delayed response on a change in the process parameter. In this example the substrate parameter shows a spectral transmission measurement of the pane measured by sensor 4. In this example the spectral transmission is measured over the width of a pane. The substrate parameters which are shown may be direct measurements of a sensor or may be derived layer properties.

The user interface may be designed such that more detailed information becomes available when clicking on a certain parameter. For example when clicking on a specific position on the graph which shows the transmission measurement, the graph may switch to a spectral transmittance response corresponding with that location on the substrate.

The user interface may allow setting an actuator. This may be done individually or by recipe. The process parameters which correspond with these settings may be saved or loaded. The process parameters may be distinguished into process parameters representing the means and process parameters representing the conditions. A gas flow may for example be set on the MFC (mass flow controller). This may for example be done in sccm (standard cubic centimeters per minute). In that case the gas flow corresponds with the means. By setting the gas flow the conditions change. This may for example be the gas partial pressure which may for example be measured with a pressure gauge. The pressure gauge may detect process conditions which are not directly linked to the process controlling means. This may for example occur if a leak occurs in the vacuum chamber or if a vacuum pump stops working.

The substrate parameters and the control parameters may be represented in different formats (e.g. values, dials, sliders, radio buttons, check boxes and so on).

The right of the screen shows a representation in time of at least one substrate parameter which represents a physical property of an intermediate stack of layers (this may for example be a direct measurement or a derived layer property), together with a representation of at least one process parameter. The substrate parameters may for example be global layer performance parameters or local layer performance parameters. The right column shows a pane number in function of time, the middle column shows a process parameter of actuator 1 in coat zone 11 (CMP 67) in function of time and the right column shows a substrate parameter measured by sensor element 4 (CMP 68) in function of time. The averaged spectral transmission over the width of the pane is shown. These graphs show a delayed response of the substrate parameter of sensor element 4 on a change of the process parameter of actuator 1. As illustrated, the process parameters and substrate parameters may be represented in different ways. They may for example be represented as a graph (e.g. as a bar graph), as numeric values, as colors (e.g. a different color may be used if a parameter crosses a threshold). The parameters may also be shown versus an acceptable tolerance window or limit values (e.g. the vertical dashed lines in the right bar graph showing the substrate parameter in function of time).

The timing of the at least one substrate parameter may be shifted with regard to the timing of the at least one process parameter in order to relate the parameters to each other. Shifting of the timing may be done by taking into account the speed of the substrate (e.g. glass panes) in the vacuum deposition system. Control parameters and process parameters may for example be correlated per glass pane. A different time scale may be used for the different parameters.

Based on the response from the at least one substrate parameter an indication for at least one process controlling means setting adjustment may be represented. This may for example be done by showing an actual control parameter and by showing the suggested value of the control parameter. It may also be done by suggesting on how to change a specific process controlling means (e.g. by showing an arrow next to a control parameter wherein the arrow has a certain direction and size).

Figure 7:
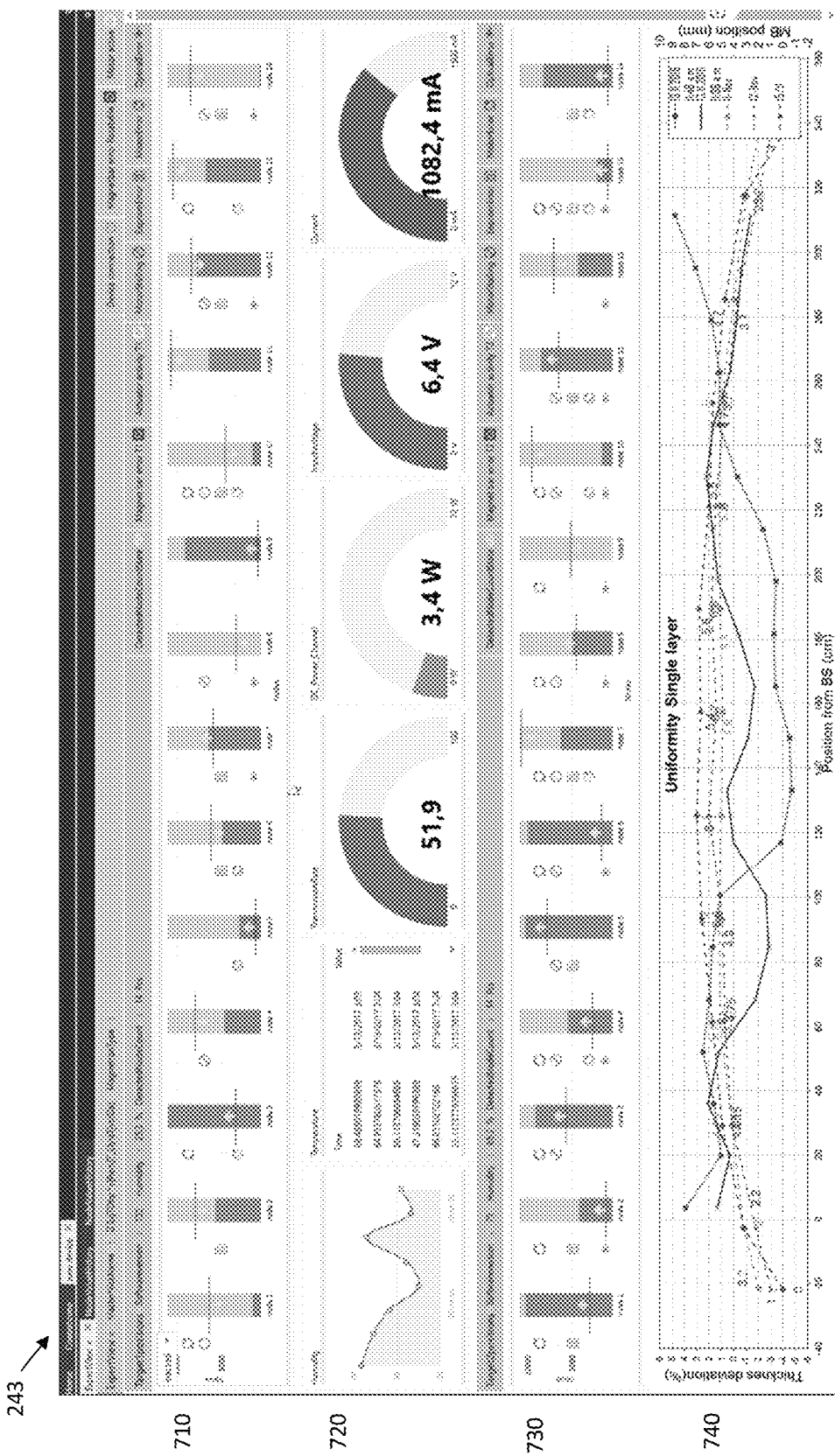

FIG. 7 shows a user interface 243, in accordance with embodiments of the present invention, wherein control parameters and substrate parameters are linked. This exemplary user interface is subdivided in different rows 710, 720, 730, 740, each showing different types of information. FIG. 7 is shown as an example for illustration purposes solely, and is in no way intended to be limiting for the present invention. Both the number of rows and the information illustrated per row can differ to a large extent from what is illustrated in FIG. 7.

In a first row 710 a process parameter per node (corresponding with a target position) is illustrated in a bar graph. In this bar graph the actual value of the process parameter, the desired value of the process parameter and the direction in which the process parameter should be controlled or adjusted are shown. Other control parameters (such as the number and state of adjustment positions (detected node count and detected node count state), whether a magnet bar error occurs, the actuator activity state, whether motor stalling occurs, whether an Eeprom error occurs, whether a motor error occurs or whether an optical error occurs) for each node are illustrated by symbols.

A second row 720 is subdivided in different subwindows each showing different process parameters. In a first subwindow the humidity is shown in function of time (graph), in a second subwindow the temperature is shown in function of time (table), in a third subwindow the transmission rate is shown (bar graph), in a fourth subwindow the DC power channel is shown (bar graph), in a fifth subwindow the input voltage is shown (bar graph), in a sixth subwindow the current is shown (bar graph). This is just for the purpose of illustration and other or more parameters from a specific cathode may be depicted; both actual settings (from the third subwindow onwards) or historic or trend data (for the first two subwindows). The invention is not limited to these process parameters. Other process parameters such as for example the external and internal pressure of a compartment may also be shown.

In a third row 730 also process parameters are shown per node. This is similar to what is shown in the first row 710. A compartment typically contains a dual magnetron configuration and has 2 targets; e.g. allowing AC use power switching between both targets for certain advantageous process behavior. Where, in the embodiment illustrated, row 710 depicts a process parameter per node for the first target, row 730 depicts the individual settings for the second target.

In the fourth row 740 substrate parameters are shown which represent a physical property of an intermediate stack of layers. In this graph the thickness deviation of a single layer, being deposited by the dual cathode in function of the position is shown. The different curves correspond with thickness measurements at different moments in time.

The process parameters may be shown such that a trend on actuating controlling means settings is visible (by arrows on a slider or by a histogram). The user interface may show spatially corresponding substrate parameters.

A vacuum deposition system in accordance with embodiments of the present invention may comprise a feedback system and/or a monitoring device in accordance with embodiments of the present invention. The feedback system closes the control loop for controlling properties of a single layer or a multiple layer stack. The display device allows visually taking knowledge of what happens in the closed control loop, both in terms of setting of control parameters, and in terms of resulting substrate parameters. In particular embodiments, the display device facilitates the operator for closing the control loop. The operator may for instance interfere in the closed loop by overruling particular settings. This may for example be used in case of emergency, when the operator notices that the system evolves in an out-of-control direction, or when the operator notices that the evolution towards an acceptable and stable setting goes too slowly. In all cases, the control loop is closed by taking into account at least one substrate parameter which represents a property of an intermediate stack of layers. The feedback system and the display device may even be used in parallel. The display device may for example be used at start up and/or for coarse tuning of the control parameters, the feedback system may then be used for fine tuning of the control parameters. These control parameters may be used for generating further control signals.

The invention claimed is:

1. A feedback system for controlling properties of a single layer or multiple layer stack being applied on a blank or coated substrate by means of a vacuum coating process controlled by a plurality of process controllers, the feedback system comprising:
   at least one monitoring device for implementing at least two distinct measurement techniques for determining measurement signals at each of a plurality of locations spatially distributed over the blank or coated substrate, wherein a first measurement technique is adapted for being applied simultaneously to a plurality of locations, and a second measurement technique is adapted for being applied to at least one location, one of the first and second measurement techniques being a spectral transmission measurement,
   at least one processing unit adapted for receiving the measurement signals, configured for determining, from the received measurement signals, actual values of a first layer property at the plurality of locations, and of a second layer property different from the first layer property at the at least one location, and/or for determining deviations between the actual first and second layer property values and desired layer property values,
   a controller for providing actuation signals for actuating the plurality of process controllers, and for generating further control signals to further drive at least one of the plurality of process controllers in the coating process based on the determined values and/or deviations between the actual layer property values and the desired layer property values and on knowledge from a layer model expressing layer parameters as a function of settings and/or variations of at least two of the plurality of process controllers, such that the properties of the layer stack lie within predetermined tolerance values.

2. The feedback system according to claim 1, wherein the at least one processing unit is adapted for receiving calibration data of a nominal working point on the blank or coated substrate, and for taking this into account in determining actual values of the first layer property and of the second layer property.

3. The feedback system according to claim 2, further comprising a first storage device for storing calibration data of the nominal working point on the blank or coated substrate.

4. The feedback system according to claim 1, further comprising a second storage device for storing the layer model of the layer being applied on the substrate.

5. The feedback system according to claim 1, wherein the monitoring device is configured for implementing, as the other one of the first and second measurement techniques, any of a spectral transmission measurement covering at least a significant band of the visual spectrum, a spectral transmission measurement in the infrared spectrum, a non-contact measurement technique, a specular or diffuse reflection measurement, an ellipsometry measurement, a visual inspection.

6. The feedback system according to claim 1, wherein the at least one monitoring device comprises a plurality of first sensor elements for determining measurement signals at each of the plurality of locations spatially distributed over the coated substrate.

7. The feedback system according to claim 1, wherein the at least one monitoring device comprises a plurality of second sensor elements for determining measurement signals at a plurality of locations spatially distributed over the coated substrate.

8. The feedback system according to claim 1, wherein the at least one monitoring device is implemented as an in-situ measurement system.

9. The feedback system according to claim 1, implemented in a vacuum coating process which is an in-line process.

10. The feedback system according to claim 1, further comprising a display device for monitoring parameters of the system, the display device comprising:
- an input interface configured for receiving at least one process parameter, for which the vacuum coating process requires an input, and at least one substrate parameter which represents a physical property of an intermediate stack of layers, and
- a user interface adapted for displaying on a display device the at least one process parameter and the at least one substrate parameter, such that the influence of the at least one process parameter on the at least one substrate parameter is illustrated.

11. A method for controlling properties of a single layer or multiple layer stack being applied on a blank or coated substrate by means of a vacuum coating process controlled by a plurality of process controllers, the method comprising:
- initiating the coating process of the single layer or multiple layer stack, by driving the plurality of process controllers,
- measuring measurement signals in a plurality of locations spatially distributed over the coated substrate, thus determining at least one measurement signal at each of the measurement locations, the measuring being by at least two distinct measurement techniques, wherein a first measurement technique is applied simultaneously to a plurality of locations, and a second measurement technique is applied to at least one location, one of the first and second measurement techniques being a spectral transmission measurement,
- using the measurement signals and knowledge from a layer model expressing layer parameters as a function of settings and/or variations of at least two of the plurality of process controllers, for determining actual values of at least two different layer properties at the plurality of locations, and/or for determining deviations between the actual layer property values and desired layer property values,
- further driving the plurality of process controllers in the coating process based on the determined values and/or deviations between the actual layer property values and the desired layer property values at the plurality of locations and on knowledge from the layer model, such that properties of the single or multiple layer stack being applied lie within predetermined tolerance values.

12. The method according to claim 11, furthermore comprising calibrating a nominal working point on the blank or coated substrate.

13. The method according to claim 12, wherein determining at least two different thin film properties at the plurality of locations takes into account knowledge from the calibrated nominal working point.

14. The method according to claim 11, wherein both the first measurement technique and the second measurement technique are applied in-situ while the substrate moves through the vacuum deposition process.

15. The method according to claim 11, wherein measuring measurement signals according to the other one of the measurement techniques comprises performing a non-contact measurement technique.

16. The method according to claim 15, wherein measuring measurement signals according to the other one of the measurement techniques comprises performing any of a spectral transmission measurement in infrared, a non-contact measurement technique, a specular or diffuse reflection measurement, an ellipsometry measurement, a visual inspection.

17. The method according to claim 11, wherein driving the plurality of process controllers in the coating process comprises driving process controllers having a having a different spatial impact on the layer being applied.

\* \* \* \* \*